US012648118B2

(12) United States Patent
Huang et al.

(10) Patent No.: US 12,648,118 B2
(45) Date of Patent: Jun. 2, 2026

(54) SWITCHING POWER SUPPLY STRUCTURE

(71) Applicant: MORNSUN GUANGZHOU SCIENCE & TECHNOLOGY CO., LTD., Guangzhou (CN)

(72) Inventors: Yongxian Huang, Guangzhou (CN); Huayi Shen, Guangzhou (CN); Gengwu Li, Guangzhou (CN); Wei Liu, Guangzhou (CN); Jie Liu, Guangzhou (CN)

(73) Assignee: MORNSUN GUANGZHOU SCIENCE & TECHNOLOGY CO., LTD., Guangzhou (CN)

( * ) Notice: Subject to any disclaimer, the term of this patent is extended or adjusted under 35 U.S.C. 154(b) by 187 days.

(21) Appl. No.: 18/431,559

(22) Filed: Feb. 2, 2024

(65) Prior Publication Data

US 2024/0179881 A1     May 30, 2024

Related U.S. Application Data

(63) Continuation of application No. PCT/CN2022/112348, filed on Aug. 15, 2022.

(30) Foreign Application Priority Data

Aug. 17, 2021     (CN) .......................... 202110944928.5

(51) Int. Cl.
*H05K 7/20*          (2006.01)
*H02M 7/00*          (2006.01)
(Continued)

(52) U.S. Cl.
CPC ............ *H05K 7/209* (2013.01); *H02M 7/003* (2013.01); *H05K 7/1427* (2013.01); *H05K 9/00* (2013.01)

(58) Field of Classification Search
None
See application file for complete search history.

(56) References Cited

U.S. PATENT DOCUMENTS 5,172,305 A * 12/1992 DeWilde .............. H05K 7/1425
                                                                    361/796
5,461,542 A * 10/1995 Kosak ................ H05K 7/20854
                                                                    165/185

(Continued)

FOREIGN PATENT DOCUMENTS

CN          104660017 A     12/2017
CN          210986649 U     7/2020

*Primary Examiner* — Courtney L Smith
(74) *Attorney, Agent, or Firm* — Westbridge IP LLC

(57)          ABSTRACT

A switching power supply structure includes a housing, a base and circuit boards, where the housing and the base enclose a cavity for accommodating the circuit boards, and a first heat dissipation channel is formed at an opening of the cavity; the housing consists of a top plate and two side plates, and a plurality of heat dissipation holes, including polygonal holes, are reserved in the housing in an array form, which forms a second heat dissipation channel. The first and second heat dissipation channels are provided, with the heat dissipation holes of the second heat dissipation channel having polygonal structures, which enlarges the heat dissipation area, achieving simple structure and good heat dissipation effect. Furthermore, due to the structural optimization of the housing and the base, the automation degree of product assembly is improved, thus lowering the cost of materials for the entire power supply housing structure.

8 Claims, 6 Drawing Sheets

(51) Int. Cl.
    *H05K 7/14*         (2006.01)
    *H05K 9/00*         (2006.01)

(56)                References Cited

U.S. PATENT DOCUMENTS

| | | | | |
|---|---|---|---|---|
| 5,777,848 | A * | 7/1998 | McAnally | G06F 1/188 |
| | | | | 361/725 |
| 7,848,088 | B2 * | 12/2010 | Liu | G06F 1/188 |
| | | | | 248/220.21 |
| 8,000,096 | B2 * | 8/2011 | Nemoz | H05K 7/1452 |
| | | | | 385/24 |
| 8,681,501 | B2 * | 3/2014 | Govindasamy | G06F 1/203 |
| | | | | 174/16.3 |
| 9,161,475 | B2 * | 10/2015 | Ng | H05K 7/1487 |
| 2006/0082973 | A1 * | 4/2006 | Egbert | H05K 7/20154 |
| | | | | 361/709 |
| 2019/0320555 | A1 * | 10/2019 | Flavin | H05K 7/20409 |

\* cited by examiner

SWITCHING POWER SUPPLY STRUCTURE

CROSS-REFERENCE TO RELATED APPLICATIONS

This application is a continuation of International Application No. PCT/CN2022/112348, filed on Aug. 15, 2022, which claims priority to Chinese Patent Application No. 202110944928.5, filed on Aug. 17, 2021. All of the aforementioned applications are incorporated herein by reference in their entireties.

TECHNICAL FIELD

The present disclosure relates to the technical field of switching power supplies, and in particular, to a switching power supply structure.

BACKGROUND

Most of the existing switching power supply products need to use housings to support and protect circuit boards so as to meet the safety regulations and customer application requirements. In order to pursue lower cost, a main power device is generally disposed at a side edge of a Printed Circuit Board (PCB), a fastener is configured to connect the power device and a housing together, and the housing dissipates heat, or is attached to a bottom surface of the PCB; a heat-conducting medium is additionally disposed between the power device and the housing, which achieves heat dissipation through the housing, thus omitting a separate radiator; and therefore, the housing used for heat dissipation is usually made of aluminum alloy, while the housing used for fixation and protection is made of steel.

The common disassembly method for the housing used for heat dissipation is to add two bent side plates to a bottom plate, or three bent side plates to the bottom plate. The connection between each of the side plates and housing is generally achieved by only disposing one screw at the corner position, and buckles are available at other positions. In this way, the entire housing structure requires a lot of aluminum alloy materials, which is costly. Moreover, the buckles of the housing structure are easy to detach under external forces.

SUMMARY

In view of this, the present disclosure provides a switching power supply structure, which is simple to disassemble, low in total material cost, reliable in structure, and good in heat dissipation effect. The technical solution provided by the present disclosure is as follows.

A switching power supply structure includes a housing, a base and circuit boards, where the housing and the base enclose a cavity for accommodating the circuit boards, and a first heat dissipation channel is formed at an opening of the cavity; and a plurality of heat dissipation holes, including polygonal holes, are reserved in the housing in an array form, which forms a second heat dissipation channel.

Further, the heat dissipation holes include orthohexagonal holes and parallelogram holes surrounding the orthohexagonal holes, and the long sides of the parallelogram holes are parallel to the sides of the orthohexagonal holes.

Further, the heat dissipation holes include orthohexagonal holes and parallelogram holes half surrounding the orthohexagonal holes, and the long sides of the parallelogram holes are parallel to the sides of the orthohexagonal holes.

Further, the housing consists of a top plate, a first side plate, and a second side plate, where the first side plate and the second side plate are formed by bending the top plate, and the first side plate and the second side plate are adjacent and fixed by riveting.

Further, the base is composed of a bottom plate and a third side plate, and the third side plate is formed by bending the bottom plate.

Further, protruding clamping points are provided on the base, and clamping slots matching the protruding clamping points are formed in the circuit boards.

Further, the base is provided with bayonets and the protruding clamping points, the circuit boards are provided with protrusions and the clamping slots, the bayonets are matched with the protrusions, and the protruding clamping points are matched with the clamping slots, which achieves pre-locating of the circuit boards.

Further, the housing and the base are provided with buckles that limit each other.

Further, the housing is provided with an I-shaped buckle, an L-shaped buckle and screw holes, the base is provided with a lug hook, an L-shaped buckle and countersinks, the L-shaped buckle on the housing is buckled with the L-shaped buckle on the base, the I-shaped buckle on the housing is matched with the lug hook on the base, and the screw holes reserved in the housing are matched with the countersinks reserved in the base, with a screw fixing manner being adopted, which implements the assembly of the housing and the base.

Further, the housing is made of steel, and the base is made of aluminum alloy.

Compared with the prior art, according to the present disclosure, the first and second heat dissipation channels are provided, with the heat dissipation holes of the second heat dissipation channel having polygonal structures, which enlarges the heat dissipation area, achieving simple structure and good heat dissipation effect. Furthermore, due to the structural optimization of the housing and the base, the automation degree of product assembly is improved, thus lowering the cost of materials for the entire power supply housing structure.

3

The specific implementation of the present disclosure is hereby described in detail with an embodiment, but it should not be construed as a limitation to the present disclosure.

Figure 1:
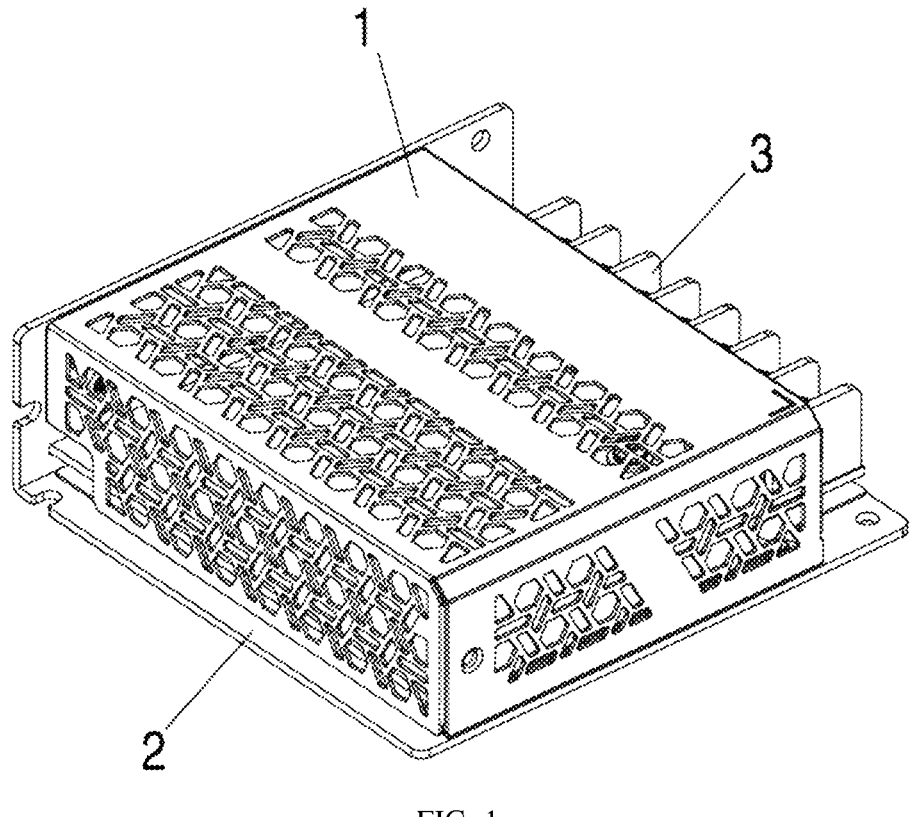
FIG. 1 is a schematic diagram of a switching power supply structure according to the present disclosure.

As shown in FIG. 1, a switching power supply structure includes a housing 1, a base 2 and circuit boards 3, where the housing 1 and the base 2 enclose a cavity for accommodating the circuit boards 3, and a first heat dissipation channel is formed at an opening of the cavity; and a plurality of heat dissipation holes are reserved in the housing 1 in an array form, which forms a second heat dissipation channel.

Figure 2:
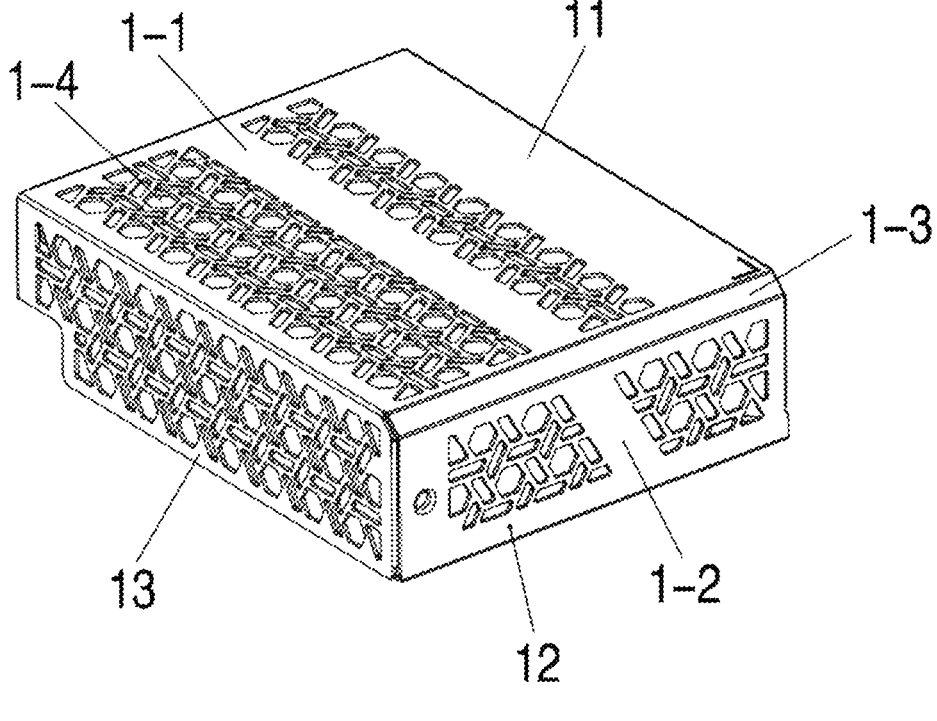
FIG. 2 is a schematic diagram I of the structure of a housing according to the present disclosure.
Figure 3:
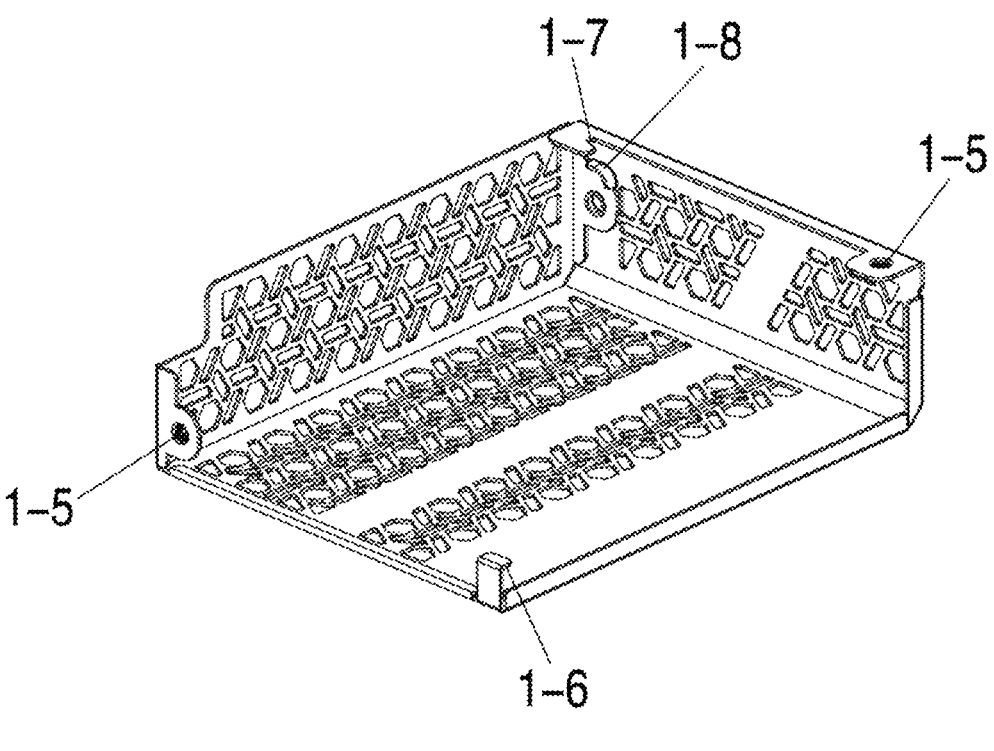
FIG. 3 is a schematic diagram II of the structure of the housing according to the present disclosure.

As shown in FIG. 2 to FIG. 3, the housing 1 is made of steel. The housing 1 includes a top plate 11, a first side plate 12 and a second side plate 13. The first side plate 12 and the second side plate 13 are formed by bending the top plate 11. The top plate 11, the first side plate 12 and the second side plate 13 are all provided with a plurality of heat dissipation holes 1-4 in an array form, and the hole shapes of the heat dissipation holes 1-4 include regular hexagons and parallelograms surrounding the regular hexagons, or include regular hexagons and parallelograms half surrounding the regular hexagons, where the long sides of the parallelograms are parallel to the sides of the regular hexagons; and due to the arrangement of the heat dissipation holes in these shapes and structures, the heat dissipation area of the product is greatly enlarged, and the product is simple in structure and good in heat dissipation effect. The top plate 11 is provided with a space for an unperforated section 1-1, and the unperforated section 1-1 can be used to place the LOGO of a company, highlighting the product brand. The first side plate 12 is provided with a space for an unperforated section 1-2. A chamfered C angle 1-3 is provided at a connection part between the top plate 11 and the first side plate 12, and the first side plate 12 and the second side plate 13 are fixed by riveting.

As shown in FIG. 3, the housing 1 is provided with screw holes 1-5, an I-shaped buckle 1-6, an L-shaped buckle 1-7, and a flanging 1-8 for achieving a connection with the base 2.

Figure 4:
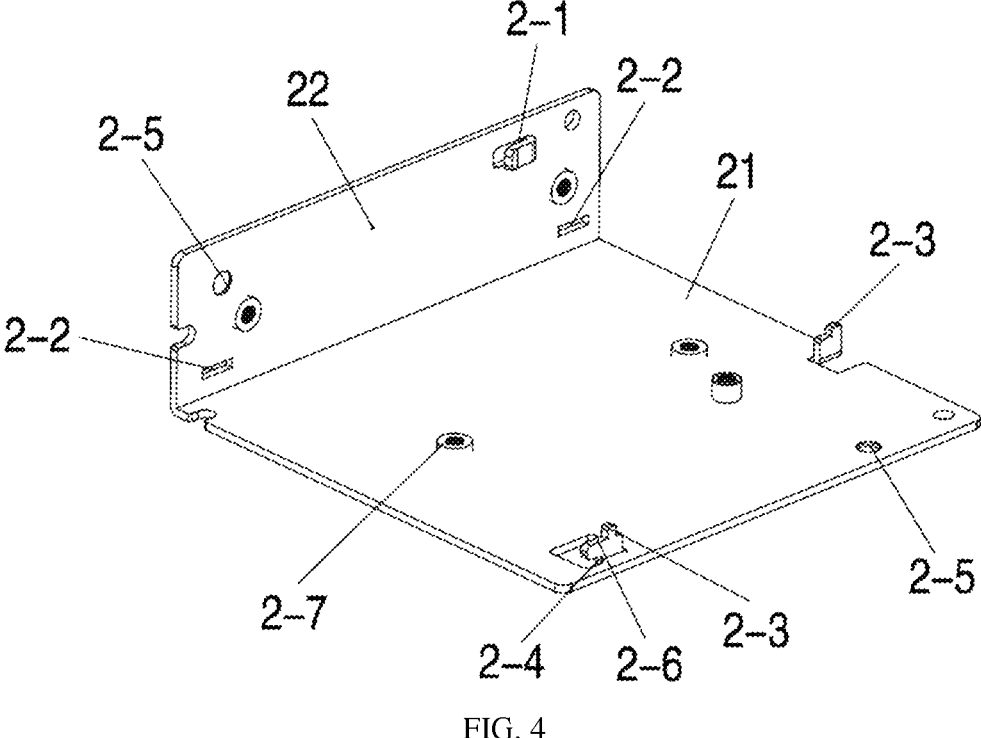
FIG. 4 is a schematic diagram of the structure of a base according to the present disclosure.

As shown in FIG. 4, the base 2 is made of aluminum alloy. The base 2 includes a bottom plate 21 and a third side plate 22. The bottom plate 21 is provided with protruding clamping points 2-3, an L-shaped buckle 2-4, countersinks 2-5, a bent step 2-6, and riveting nuts 2-7. The third side plate 22 of the base is provided with a lug hook 2-1, bayonets 2-2, and countersinks 2-5.

Figure 5:
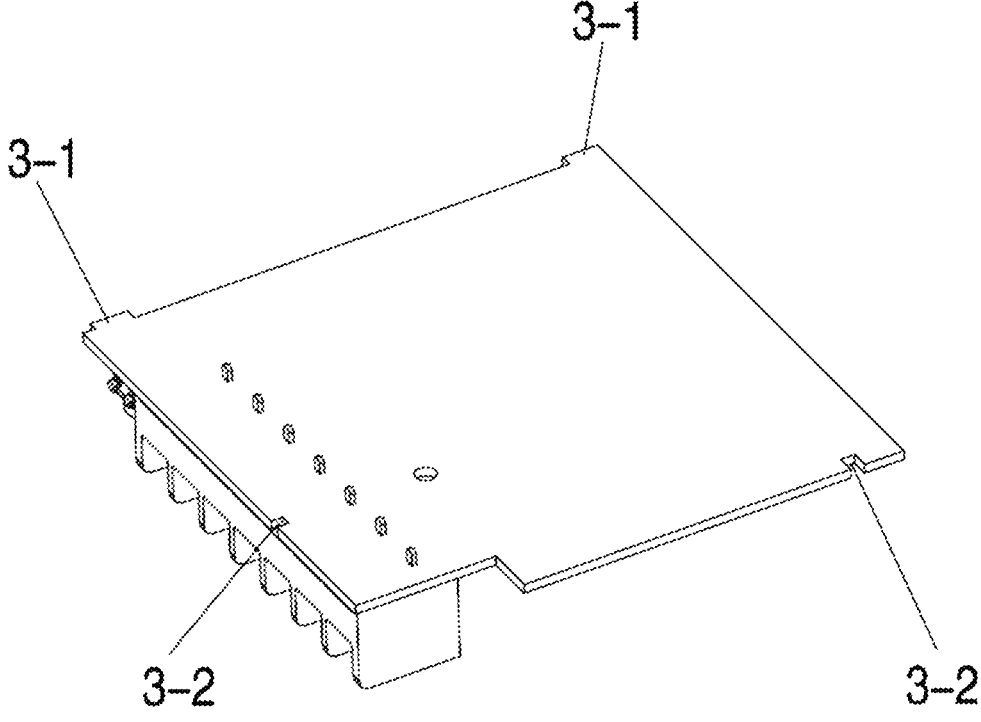
FIG. 5 is a schematic diagram of the structure of a circuit board according to the present disclosure.

As shown in FIG. 5, the circuit boards 3 are provided with protrusions 3-1 and clamping slots 3-2.

Figure 6:
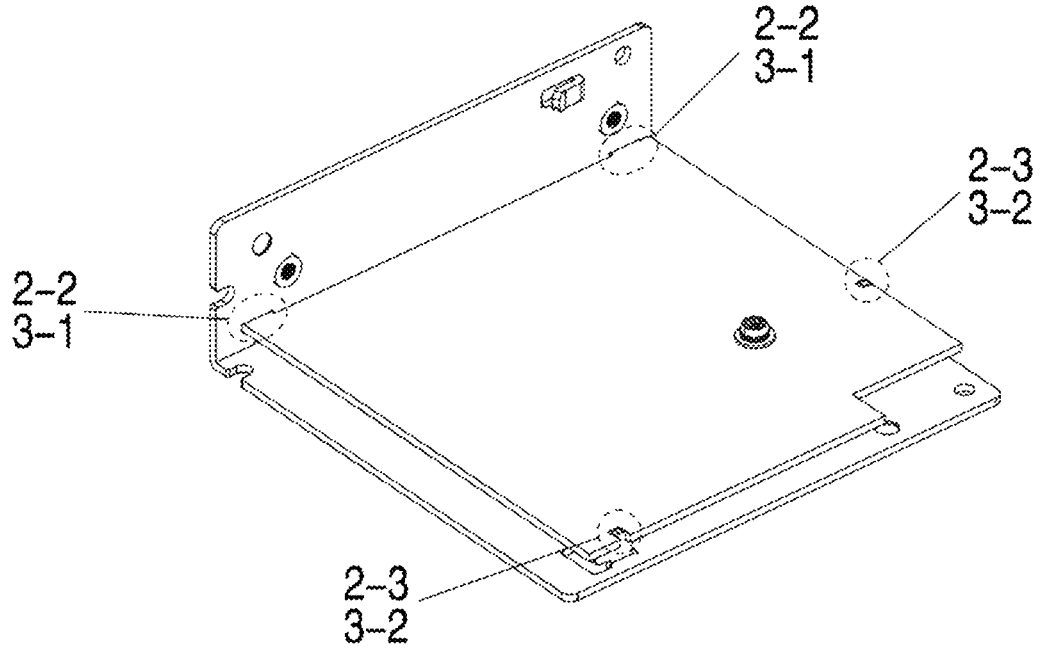
FIG. 6 is a schematic diagram of the structure of the circuit board and the base according to the present disclosure after assembly.

As shown in FIG. 6, the circuit board 3 is placed on the base 2 in the following way: the bayonets 2-2 of the base 2 are matched with the protrusions 3-1 of the circuit board 3, the protruding clamping points 2-3 of the base 2 are matched with the clamping slots 3-2 of the circuit board 3, the protrusions 3-1 of the circuit board 3 are inserted into the bayonets 2-2 of the base 2 adapting thereto, and then the circuit board 3 is laid flat; and the protruding clamping points 2-3 of the base 2 are allowed to be just inserted into the clamping slots 3-2 of the circuit board 3, and are supported on the bent step 2-6, so that the circuit board 3 and the bottom plate 21 are disposed in parallel and spaced apart, and the circuit board is pre-located. Then, automation equipment can be used to lock fastening screws of the circuit board 3.

Figure 7:
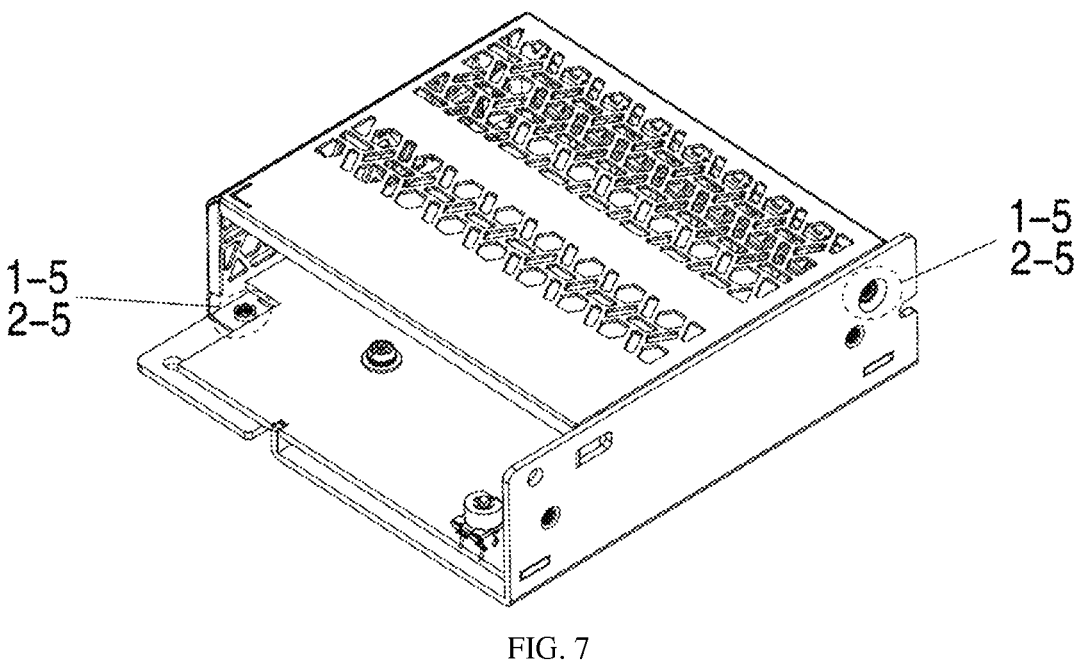
FIG. 7 is a schematic diagram of the structure of the housing and the base according to the present disclosure after assembly.
Figure 8:
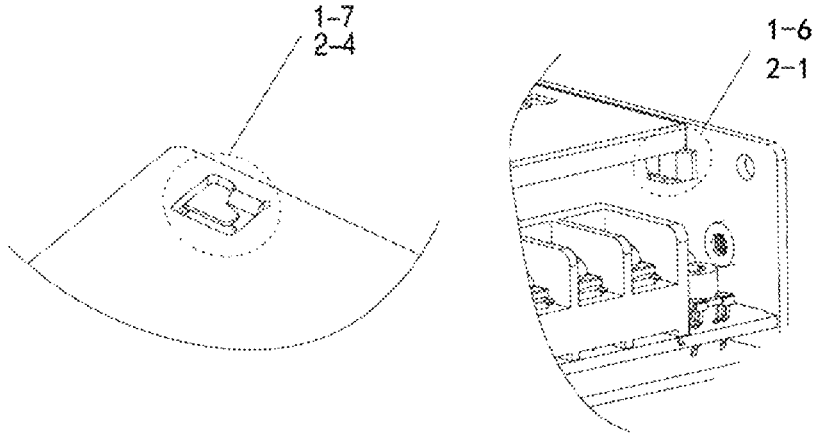
FIG. 8 is a partial schematic diagram I of the housing and the base according to the present disclosure after assembly.

As shown in FIG. 7 to FIG. 8, the housing 1 and the base 2 are buckled together to form the cavity that accommodates the circuit boards 3 and has an opening on one side. Specifically, the buckling way is as follows: the L-shaped buckle 1-7 of the housing 1 is buckled with the L-shaped buckle 2-4 of the base 2, the I-shaped buckle 1-6 of the housing 1 is matched with the lug hook 2-1 of the base 2, and the screw holes 1-5 of the metal housing 1 are matched with the countersinks 2-5 of the base 2, with a screw fixing manner being adopted, which implements the assembly of the housing 1 and the base 2.

Figure 9:
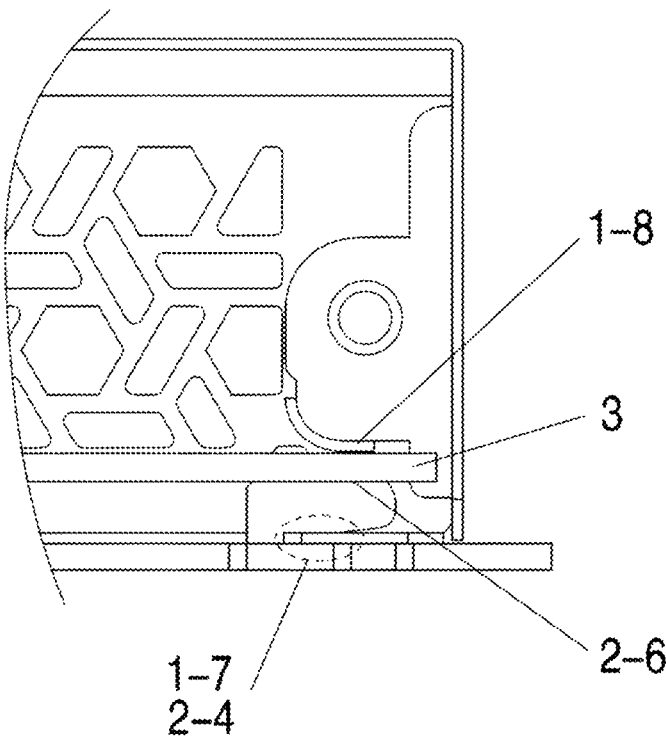
FIG. 9 is a partial schematic diagram II of the housing and the base according to the present disclosure after assembly.

As shown in FIG. 9, the bent step 2-6 of the base provide a support for the circuit boards 3. After the L-shaped buckle 1-7 of the housing 1 is buckled with the L-shaped buckle 2-4 of the base 2, the flanging 1-8 of the housing 1 and the bent step 2-6 of the base 2 will clamp the circuit board 3, thus achieving an effect equivalent to fixing by locking screws. Even if a patch device on the bottom surface of the circuit board 3 requires the addition of a heat-conducting medium for heat dissipation, the circuit board 3 will not be lifted.

The foregoing descriptions are merely exemplary embodiment of the present disclosure. It should be pointed out that the above exemplary embodiment should not be regarded as limiting the present disclosure. For those of ordinary skill in the art, some improvements and embellishments without departing from the spirit and scope of the present disclosure can also be made, which should be regarded as the protection scope of the present disclosure, but will not be repeated herein with examples. Therefore, the protection scope of the present disclosure shall be as defined in the Claims.

The invention claimed is:

1. A switching power supply structure, comprising a housing, a base and circuit boards, wherein the housing and the base form a space with an open side for accommodating the circuit boards, and a first heat dissipation channel is formed at the open side; and a plurality of heat dissipation holes, comprising polygonal holes, are reserved in the housing in an array form, which forms a second heat dissipation channel;
   wherein the heat dissipation holes comprise orthohexagonal holes and parallelogram holes surrounding or half surrounding the orthohexagonal holes, and the long sides of the parallelogram holes are parallel to the sides of the orthohexagonal holes.

2. The switching power supply structure according to claim 1, wherein the housing consists of a top plate, a first side plate, and a second side plate, the first side plate and the second side plate are formed by bending the top plate, and the first side plate and the second side plate are adjacent and fixed by riveting.

3. The switching power supply structure according to claim 1, wherein the base is composed of a bottom plate and a third side plate, and the third side plate is formed by bending the bottom plate.

4. The switching power supply structure according to claim 1, wherein protruding clamping points are provided on the base, and clamping slots matching the protruding clamping points are formed in the circuit boards.

5. The switching power supply structure according to claim 1, wherein the base is provided with bayonets and protruding clamping points, the circuit boards are provided with protrusions and clamping slots, the bayonets are matched with the protrusions, and the protruding clamping points are matched with the clamping slots, which achieves pre-locating of the circuit boards.

6. The switching power supply structure according to claim 1, wherein the housing and the base are provided with buckles that limit each other.

7. The switching power supply structure according to claim 1, wherein the housing is provided with an I-shaped buckle, an L-shaped buckle and screw holes, the base is provided with a lug hook, an L-shaped buckle and countersinks, the L-shaped buckle is buckled with the L-shaped buckle, the I-shaped buckle is matched with the lug hook, and the screw holes are matched with the countersinks, with a screw fixing manner being adopted, which implements the assembly of the housing and the base.

8. The switching power supply structure according to claim 1, wherein the housing is made of steel, and the base is made of aluminum alloy.

* * * * *